(12) United States Patent
Takase et al.

(10) Patent No.: US 10,870,725 B2
(45) Date of Patent: Dec. 22, 2020

(54) HEAT CURABLE RESIN COMPOSITION, AND CIRCUIT BOARD WITH ELECTRONIC COMPONENT MOUNTED THEREON

(71) Applicant: SAN-EI KAGAKU CO., LTD., Tokyo (JP)

(72) Inventors: Yasuhiro Takase, Saitama (JP); Kazuki Hanada, Saitama (JP); Hiroshi Asami, Saitama (JP)

(73) Assignee: SAN-EI KAGAKU CO., LTD., Tokyo (JP)

( * ) Notice: Subject to any disclaimer, the term of this patent is extended or adjusted under 35 U.S.C. 154(b) by 0 days.

(21) Appl. No.: 15/479,457

(22) Filed: Apr. 5, 2017

(65) Prior Publication Data
US 2017/0335049 A1 Nov. 23, 2017

(30) Foreign Application Priority Data
Apr. 21, 2016 (JP) .................. 2016-085548

(51) Int. Cl.
*C08G 59/40* (2006.01)
*H05K 3/34* (2006.01)
(Continued)

(52) U.S. Cl.
CPC ......... *C08G 59/4014* (2013.01); *C08G 59/00* (2013.01); *C08G 59/5033* (2013.01); *C08K 3/22* (2013.01); *C08K 3/36* (2013.01); *C08K 5/315* (2013.01); *C08K 5/3492* (2013.01); *C08K 7/20* (2013.01); *C08L 63/00* (2013.01);
(Continued)

(58) Field of Classification Search
CPC ............ C08G 59/4014; C08G 59/00; C08G 59/5033; C08G 59/245; C08K 5/06; C08K 5/3447; C08K 5/3492; C08K 5/315; C08K 7/20; C08K 3/22; C08K 2201/005; C08K 2003/2227; C08K 2201/003; C08K 3/36; C08L 63/00; H01L 21/563; H01L 23/293; H01L 2224/83192; H01L 2224/16225; H01L 2224/73204; H05K 3/3436; H05K 3/386; H05K 2203/1178;
(Continued)

(56) References Cited

U.S. PATENT DOCUMENTS

| 2003/0148107 A1* | 8/2003 | Suzuki | B32B 15/08 428/413 |
| 2012/0168219 A1 | 7/2012 | Kitamura et al. | |
| 2016/0355711 A1 | 12/2016 | Okamoto et al. | |

FOREIGN PATENT DOCUMENTS

| JP | 2013-001811 A | 1/2013 |
| JP | 2013-059807 | 4/2013 |
| WO | WO 2015/093281 | 6/2015 |

OTHER PUBLICATIONS

Nakamura et al., JP 2013-001811 A machine translation in English, Jan. 7, 2013 (Year: 2013).*

(Continued)

*Primary Examiner* — David T Karst
(74) *Attorney, Agent, or Firm* — Nixon & Vanderhye

(57) ABSTRACT

A heat curable resin composition which allows voids to be removed by heating and vacuum operation after reflow soldering, and a circuit board with an electronic component mounted thereon are provided. The heat curable resin composition of the present embodiment includes a liquid epoxy resin, a hemiacetal ester derived from monocarboxylic acid and polyvinyl ether, a curing agent, and a filler.

5 Claims, 1 Drawing Sheet

(51) Int. Cl.
- C08K 5/315 (2006.01)
- C08K 5/3492 (2006.01)
- C08K 7/20 (2006.01)
- H01L 21/56 (2006.01)
- C08K 3/36 (2006.01)
- C08K 3/22 (2006.01)
- H01L 23/29 (2006.01)
- C08L 63/00 (2006.01)
- C08G 59/00 (2006.01)
- C08G 59/50 (2006.01)
- C08G 59/24 (2006.01)
- C08L 29/14 (2006.01)
- C08L 35/08 (2006.01)
- H05K 3/38 (2006.01)

(52) U.S. Cl.
CPC .......... *H01L 21/563* (2013.01); *H01L 23/293* (2013.01); *H05K 3/3436* (2013.01); *H05K 3/386* (2013.01); *C08G 59/245* (2013.01); *C08K 2003/2227* (2013.01); *C08K 2201/003* (2013.01); *C08K 2201/005* (2013.01); *H01L 2224/16225* (2013.01); *H01L 2224/73204* (2013.01); *H01L 2224/83192* (2013.01); *H05K 2201/10977* (2013.01); *H05K 2203/085* (2013.01); *H05K 2203/1178* (2013.01); *H05K 2203/1189* (2013.01); *Y02P 70/50* (2015.11)

(58) Field of Classification Search
CPC ... H05K 2201/10977; H05K 2203/085; H05K 2203/1189; Y02P 70/50
USPC .......................................................... 525/523
See application file for complete search history.

(56) References Cited

OTHER PUBLICATIONS

"Polyvinylether," ROMPP Online, Version 3.78, https://roempp.thieme.de/prod3/roempp.pnp, accessed Feb. 13, 2019.

* cited by examiner

HEAT CURABLE RESIN COMPOSITION, AND CIRCUIT BOARD WITH ELECTRONIC COMPONENT MOUNTED THEREON

BACKGROUND OF THE INVENTION

Field of the Invention

The present invention relates to a heat curable resin composition for use in mounting an electronic component (surface mount device) on a circuit board, and a circuit board with an electronic component mounted thereon using the composition.

Description of the Related Art

The following methods A and B are conventionally known as the surface mount technique for mounting an electronic component on a circuit board. In the method A, a flux is applied to a circuit board, and after the electronic component is mounted with a reflow device, the flux is washed off. An underfill material is then applied for filling to be heat cured. In the method B, an underfill material having a flux effect is applied to a circuit board in advance, and after mounting an electronic component, soldering and heat curing of the underfill material are performed at the same time with a reflow device.

Due to the multiple pinning and the connection pitch reduction of an electronic component along with downsizing of electronic equipment, the solder volume at a junction decreases and the gap between a circuit board and the electronic component narrows. Accordingly, the conventional methods cause reduction in reliability of electronic equipment, which is a problem.

In the method A described above, insufficient washing of the flux tends to cause ionic components to remain, and filling with the underfill material by capillary phenomenon is difficult, which are problems. In the method B described above, due to the reflow temperature higher than the curing temperature of the underfill material, the underfill material is completely cured after reflow, so that a large number of voids are produced by water generated during removal of oxide films of solder and copper, which is a problem. Furthermore, when an electronic component is temporarily placed on a circuit board to which the underfill material is applied, the underfill material is cured with air being trapped, so that a large number of voids are produced, which is a problem.

In order to solve these problems, a method including the steps of applying a heat curable resin composition to at least a part of the surface of a circuit board, mounting an electronic component on the circuit board, performing reflow soldering, vacuum operating and/or heating the applied resin at a temperature lower than the curing temperature, and then heat curing the applied resin has been proposed (refer to Japanese Patent Laid-Open No. 2013-59807).

In the methods described above, however, a problem was found that the heat curable resin composition is hardly softened by heating at a temperature lower than the curing temperature after reflow soldering, so that the removal of voids by vacuum operation is difficult. Accordingly, a heat curable resin composition which allows voids to be removed by heating and vacuum operation after reflow soldering is desired.

An object of the present invention to solve the above-mentioned problem is to provide a heat curable resin composition which allows voids to be removed by heating and vacuum operation after reflow soldering, and a circuit board with an electronic component mounted thereon.

SUMMARY OF THE INVENTION

The present inventors found that by controlling the reaction ratio of an epoxy group at 40% or less at the completion of reflow soldering, voids can be removed by heating and vacuum operation after reflow soldering.

The present invention includes the following aspects of a heat curable composition which allows the reaction ratio of an epoxy group to be controlled at 40% or less at the completion of reflow soldering.

(1) A heat curable resin composition comprising a liquid epoxy resin, a hemiacetal ester synthesized from monocarboxylic acid and polyvinyl ether, a curing agent, and a filler.

(2) The heat curable resin composition according to (1), wherein the hemiacetal ester is synthesized from 0.2 to 0.4 equivalents of monocarboxylic acid relative to an epoxy group of the epoxy resin and 1.0 to 1.5 equivalents of polyvinyl ether relative to a carboxyl group of the monocarboxylic acid.

(3) The heat curable resin composition according to (1) or (2), wherein the curing agent comprises cyanoguanidine and melamine.

(4) The heat curable resin composition according to any of (1) to (3), wherein the curing agent comprises 0.4 to 0.5 equivalents of cyanoguanidine relative to an epoxy group of the epoxy resin and 0.08 to 0.18 equivalents of melamine relative to the epoxy group.

(5) The heat curable resin composition according to any of (1) to (4), wherein the filler comprises 10 to 40 mass % of spherical filler having an average particle diameter of 0.5 to 5 μm.

(6) The heat curable resin composition according to any of (1) to (5), wherein the filler contains a fine particle having a size of 0.3 μm or less with a cumulative content of 10 mass % or less relative to the total filler content.

(7) The heat curable resin composition according to any of (1) to (6), wherein the reaction ratio of an epoxy group in the epoxy resin is 40% or less after reflow at 220 to 260° C., for 10 to 20 seconds.

(8) A circuit board with an electronic component mounted thereon comprising a circuit board, an electronic component mounted on the circuit board, and a cured product obtained by heat curing the heat curable resin composition according to any of (1) to (7), disposed between the circuit board and the electronic component.

According to the present invention, the reaction ratio of an epoxy group can be controlled at 40% or less at the completion of reflow soldering, and voids can be removed by heating and vacuum operation after reflow soldering.

DETAILED DESCRIPTION OF THE PREFERRED EMBODIMENTS

Figure 1A:
FIGS. 1A to 1F are cross sectional views of steps, illustrating an aspect of the surface mount technique with use of the heat curable resin composition in the present embodiment.

The embodiment of the present invention (hereinafter referred to as "present embodiment") is described in details with reference to drawings as needed as follows, though the present invention is not limited thereto and various changes may be made without departing from the scope of the invention.

A solder for general use for electrical connection in the surface mount technique with use of the heat curable resin composition of the present embodiment is made of an alloy mainly composed of tin, silver and copper, having a melting point of about 220° C. The step of reflow soldering includes preheating at 120 to 160° C. for about 1 minute, and heating at 220 to 260° C. for about 10 seconds for solder connection.

Consequently, various reactions of the heat curable resin composition start in the step of reflow soldering:

1) Production of carboxylic acid resulting from the dissociation reaction of hemiacetal ester;

2) Reaction between carboxylic acid and oxide films of solder and copper (metal oxides);

3) Reaction between carboxylic acid and epoxy resin; 4) Salt formation reaction between carboxylic acid and heat curing agent;

5) Reaction between metal carboxylate and epoxy resin; and

6) Reaction between epoxy resin and heat curing agent.

As a result, the heat curable resin composition is hardly softened by re-heating after reflow soldering, so that it becomes difficult to remove voids by vacuum operation. In other words, it is difficult to remove voids caused by trapped air or water generated during removal of the oxide films.

Through extensive study, it was found that by controlling the reaction ratio of the epoxy resin at 40% or less after reflow, the voids between a circuit board and an electronic component can be removed by heating and vacuum operation after reflow.

(Heat Curable Resin Composition)

In order to control the reaction ratio of an epoxy resin at 40% or less after reflow, the heat curable resin composition of the present embodiment contains a liquid epoxy resin, a hemiacetal ester derived from monocarboxylic acid and polyvinyl ether, a curing agent, and a filler. Each of the components contained in the heat curable resin composition of the present embodiment is described in detail as follows.

The heat curable resin composition for use in the surface mount technique in the present application contains a liquid epoxy resin. The epoxy resin functions as matrix resin. Furthermore, the epoxy resin causes a reaction with an activator (carboxylic acid) described below during curing reaction, having a function for deactivating the activator. The applied resin after curing is thereby thermally stabilized to a great extent, causing no corrosion reaction or generating no decomposition gas during heating (e.g. during heat curing of an underfill resin).

The heat curable resin composition preferably contains substantially no solvent, containing an epoxy resin in a liquid state at normal temperature. Because of containing no solvent, the heat curable resin composition can avoid the generation of voids caused by the gas resulting from volatilization of the solvent.

The liquid epoxy resin means an epoxy resin in a liquid state at normal temperature, and examples thereof include an epoxy resin having fluidity at normal temperature. Such a liquid epoxy resin has a viscosity of 20000 mPa·s or less at room temperature, preferably 1000 to 10000 mPa·s, in particular. The liquid epoxy resin has an epoxy equivalent (EEW) of 100 to 400, preferably 100 to 200. The liquid epoxy resin has a weight average molecular weight (Mw) of 200 to 1000, preferably 300 to 600.

A bisphenol-A epoxy resin, a bisphenol-F epoxy resin, a glycidyl amine epoxy resin, an alicyclic epoxy resin, or the like may be preferably used as the liquid epoxy resin. One or more of these may be used.

The bisphenol-A epoxy resin is represented by the following formula:

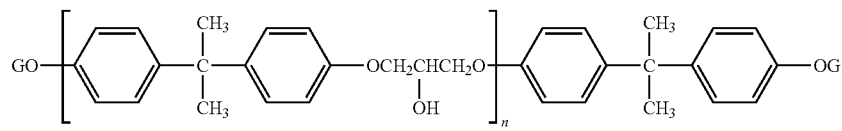

wherein n represents 0 or 1, and G represents a glycidyl group. One or more of these may be used.

The liquid bisphenol-F epoxy resin is represented by the following formula:

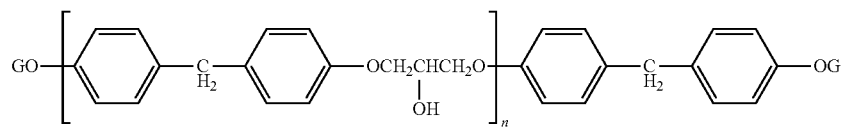

wherein n represents 0 or 1, and G represents a glycidyl group. One or more of these may be used.

A hemiacetal ester is synthesized by the reaction between monocarboxylic acid and polyvinyl ether. The carboxylic acid in the hemiacetal ester functions as activator for improving soldering properties. Since raw carboxylic acid causes reaction with the epoxy group in an epoxy resin at room temperature, the carboxylic acid is reacted with vinyl ether to produce a hemiacetal ester, so that the reaction between the carboxylic acid and the epoxy resin can be inhibited. Furthermore, the hemiacetal ester suitable for use has a dissociation temperature of 170° C. or higher, in order not to cause a reaction resulting from the dissociation during preheating. The hemiacetal esterification of the carboxylic acid can inhibit the side reactions of the heat curable resin at low temperature, so that the heat curable resin composition can have improved storage stability.

A monocarboxylic acid having one carboxyl group in a molecule is used as the carboxylic acid for hemiacetal esterification, in order not to cause gelling resulting from the cross-linking during the reaction with the epoxy resin after dissociation. Although any of aliphatic, aromatic, polycyclic aromatic, and heterocyclic monocarboxylic acids may be used, aromatic monocarboxylic acids and polycyclic aromatic monocarboxylic acids are preferred to make a nonreactive side chain through the reaction with an epoxy group, considering heat resistance.

The amount of the monocarboxylic acid blended is preferably 0.2 to 0.4 equivalents relative to an epoxy group of an epoxy resin. With less than 0.2 equivalents of monocarboxylic acid relative to 1 equivalent of an epoxy group, the removal properties of the oxide film of solder deteriorate to cause connection failure. With more than 0.4 equivalents, the epoxy group consumed through the reaction with an epoxy group decreases, so that the curing properties deteriorate.

Although a polyvinyl compound having two or more vinyl groups in a molecule may be used as the vinyl ether for hemiacetal esterification, the viscosity of the hemiacetal ester itself decreases. Use of an aliphatic polyvinyl ether or an alicyclic polyvinyl ether is therefore preferred.

The amount of the polyvinyl ether blended is preferably 1 to 1.5 equivalents relative to a carboxyl group of a monocarboxylic acid. With less than 1.0 equivalent of polyvinyl ether relative to 1.0 equivalent of monocarboxylic acid, un-hemiacetalized carboxylic acid causes a reaction with the epoxy resin even at room temperature so as to be consumed, resulting in poor connection. With more than 1.5 equivalents, remaining excessive vinyl ether causes voids and reduces the heat resistance of a cured product.

In the case of using a monovinyl ether as the vinyl ether, the amount of vinyl ether blended for hemiacetalization increases, causing problems such as the generation of voids and the reduction in heat resistance of a cured product in some cases. The hemiacetal ester made from polycarboxylic acid and polyvinyl ether forms a macromolecule to produce a gel. As a result, a uniform composition cannot be produced due to the poor compatibility with the epoxy resin.

A monocarboxylic acid and a polyvinyl ether, each having a boiling point of 200° C. or higher, are used in order to prevent the occurrence of voids resulting from gasification of themselves.

The curing agent is used to cause a reaction with an epoxy resin for the formation of a three-dimensional cross-linked structure. Cyanoguanidine and melamine are preferably used as curing agents in order to control the reaction ratio of an epoxy group at 40% or less after reflow soldering and achieve complete curing at a normal curing temperature of 150 to 180° C. With use of cyanoguanidine and melamine, no curing reaction is caused by short-time heating, so that the heat curable resin composition can be prevented from being cured even during reflow.

The amount of cyanoguanidine blended is preferably 0.4 to 0.5 equivalents relative to an epoxy group of an epoxy resin. With less than 0.4 equivalents of cyanoguanidine, the incomplete reaction of an epoxy group causes poor curing. With more than 0.5 equivalents, the curing reaction excessively proceeds in the reflow step, so that the post-defoaming properties are reduced, with voids remaining.

The amount of melamine blended is preferably 0.08 to 0.18 equivalents relative to an epoxy group of an epoxy resin. With less than 0.08 equivalents of melamine, the incomplete reaction of an epoxy group causes poor curing, as described above. With more than 0.12 equivalents, the curing reaction excessively proceeds in the reflow step, so that the post-defoaming properties are reduced, with voids remaining.

Filler is added in order to reduce the thermal expansion coefficient of an epoxy resin composition after curing and improve the thermal conductivity. Microspherical filler of silica, alumina, or the like is preferably used.

The spherical filler has an average particle diameter of preferably 0.5 µm or more in order to suppress the viscosity increase of the epoxy resin composition, and an average particle diameter of preferably 5 µm or less in order not to impede wetting and spreading of a solder bump. With use of spherical filler having an average particle diameter of less than 0.5 µm, the viscosity of the composition increases due to the excessively large surface area of the filler, so that the post-defoaming properties are reduced. With an average particle diameter of more than 5 µm, filler trapping occurs during solder connection, resulting in poor connection.

More preferably, the total of the fine particle having a size of 0.3 µm or less contained in the spherical filler is 10 mass % or less. The reason is that with a cumulative content of a fine particle having a size of 0.3 µm or less contained in the spherical filler of more than 10 mass %, the viscosity of the composition increases due to the excessively large surface area of the filler, so that the post-defoaming properties are reduced.

The spherical filler content is preferably 10 mass % or more and 40 mass % or less. With a spherical filler content of less than 10 mass %, the curing shrinkage increases, so that a gap tends to occur between a chip or a circuit board and the epoxy resin composition. With a spherical filler content of 50 mass % or more, the post-defoaming properties and the connection properties are reduced.

The heat curable resin composition may contain a defoaming agent such as silicone oil, a silane coupling agent, Aerosil, and the like, as other additives.

In the heat curable resin composition of the present embodiment, the reaction ratio of the epoxy group in the epoxy resin is 40% or less after heat treatment at 220 to 260° C., for 10 to 20 seconds. Consequently, even when reflow soldering is performed under such heat treatment conditions, the heat curable resin is prevented from being cured.

The heat curable resin composition of the present embodiment can be softened after reflow soldering by reheating at a temperature (80° C. to 160° C.) lower than the heat treatment temperature of the reflow soldering, so that voids contained in the resin can be removed by vacuum operation.

(Surface Mount Method)

The surface mount method using the heat curable resin composition of the present embodiment is described below.

Figure 1B:
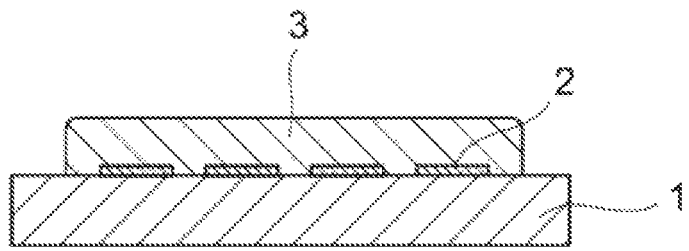

As shown in FIG. 1A, a circuit board 1 such as a printed wiring board is prepared. As shown in FIG. 1B, a heat curable resin composition 3 of the present application is then applied to at least one part of the surface of the circuit board 1 (including the whole surface). For example, the composition may be applied to at least a part of the metal surface on the circuit board 1. Examples of the metal include a pure metal (e.g. copper) and an alloy (e.g. solder). One or more metals may be used. The heat curable resin composition 3 has a layer thickness of usually 10 to 50 µm.

Figure 1C:
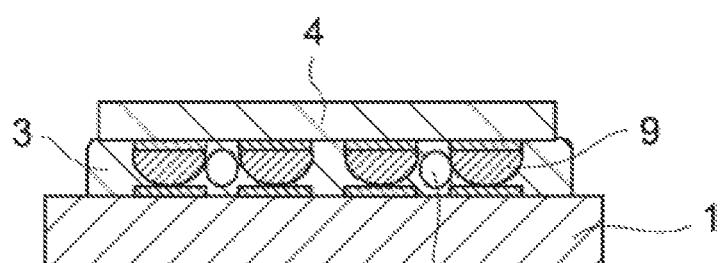

As shown in FIG. 1C, an electronic component 4 is then temporarily placed on the circuit board 1. In the step of temporarily placing the component, air may be trapped to cause a bubble 10 in some cases. The heat curable resin composition of the present embodiment may also be applied to a surface mount technique for electronic component with a large size such as 50 mm square or more. Examples of the electronic component 4 include a package component (e.g. BGA component, CSP component, MCM component, IPM component, and IGBT component) and a semiconductor chip.

Figure 1D:
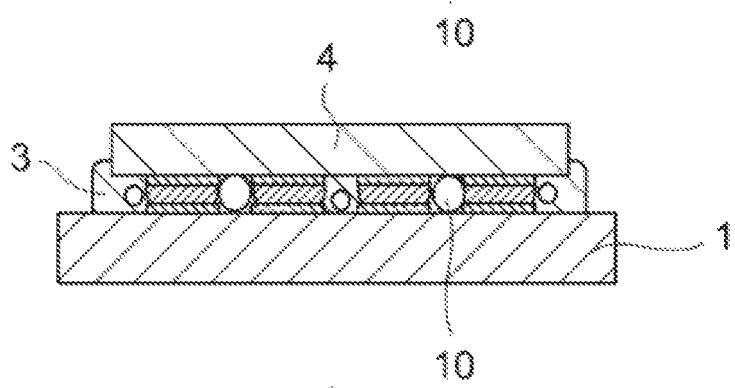

As shown in FIG. 1D, reflow soldering is then performed. The reflow soldering includes a preheating step at 120 to 140° C. for 40 to 80 seconds, a temperature-raising step at 140 to 220° C. for 5 to 15 seconds, and a reflow step at 220 to 260° C. for 10 to 30 seconds. An excessively long heating time may cause a curing reaction of the applied resin, which is undesirable. During reflow soldering, oxides and the like on the surface of molten solder may cause a reduction reaction or the like with hemiacetal ester in the heat curable resin composition, resulting in production of water or the like in some cases. The produced water or the like evaporates and expands to cause further occurrence of a bubble 10.

Figure 1E:
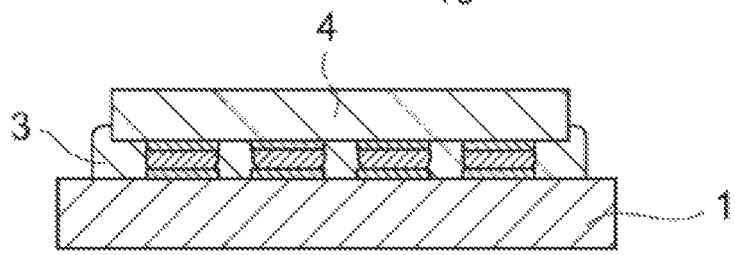

As shown in FIG. 1E, vacuum operation and/or heating at a temperature lower than the curing temperature of the heat curable resin composition are then performed for defoaming. Air trapped during temporal placement of an electronic component (FIG. 1C), and water and the bubble 10 caused during removal of the oxide film of solder during the reflow step (FIG. 1D) are thereby removed. As the conditions for the vacuum operation, for example, a degree of vacuum of 1 to 500 kPa (50 to 300 kPa, in particular) for 1 to 60 minutes (5 to 30 minutes, in particular) may be preferred.

Heating for defoaming is performed at a temperature lower than the curing temperature of the heat curable resin composition. The heating allows not only the heat curable resin composition to be softened, dewatered and defoamed, but also allows the softened heat curable resin composition to be flattened through absorption of the irregularities on the surface of a circuit board. As the specific heating conditions for defoaming, for example, a temperature of 60 to 150° C. (80 to 130° C., in particular) for 1 to 60 minutes (10 to 20 minutes, in particular) may be preferred.

Figure 1F:
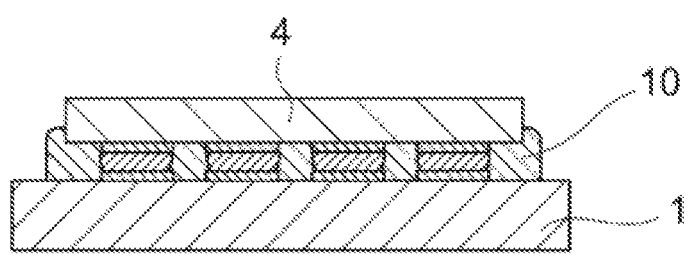

As shown in FIG. 1F, the heat curable resin composition is then heat cured to make a cured product 10. A temperature equal to or higher than the initiation temperature of the curing reaction of the curing agent is required as heat curing conditions. More specifically, the conditions at 150 to 200° C. for 1 to 4 hours may be employed. Under the conditions, the epoxy resin causes a reaction with the curing agent to form a three-dimensional cross-linked structure. On this occasion, the dissociation reaction of hemiacetal ester produces carboxylic acid, and the resulting reaction between carboxylic acid and the epoxy resin deactivates the activator. No carboxylic acid, therefore, remains, so that there exists no cause such as corrosion to lower the reliability.

As described above, the circuit board with an electronic component mounted thereon of the present application is manufactured. In the method for manufacturing the circuit board with an electronic component mounted thereon, disposition of individual fluxes is not required as described above.

The circuit board with an electronic component mounted thereon of the present embodiment manufactured as described above includes a circuit board 1, an electronic component 4 mounted on the circuit board 1, and a cured product 10 which is obtained by heat curing the heat curable resin composition 3 of the present embodiment disposed between the circuit board 1 and the electronic component 4.

The circuit board with an electronic component mounted thereon of the present embodiment can prevent the occurrence of voids in a connection material 10 between the circuit board 1 and the electronic component 4, so that the reliability of the electrical connection and the mechanical joint between the circuit board 1 and the electronic component 4 can be improved, resulting in the improved reliability of the circuit board with an electronic component mounted thereon.

EXAMPLES

The present invention is specifically described with reference to Examples and Comparative Examples as follows. The present invention is not limited to the following Examples, though.

As shown in the following Tables 1 and 2, an epoxy resin, hemiacetal ester, cyanoguanidine, melamine, and spherical filler each were weighed, mixed with a mixer for 30 minutes, and dispersed with a three-roll mill. The resultant epoxy resin composition was stirred and defoamed under vacuum at 100 kPa for 10 minutes, so that each of the heat curable resin compositions in Examples and Comparative Examples was obtained. The numerical values shown in Tables 1 and 2 indicate parts by mass relative to 100 parts by mass of the epoxy resin. In Tables 1 and 2, the term "0.3 µm or less" means a cumulative content of particles having a size of 0.3 µm or less. In Tables 1 and 2, the average particle diameter of the filler for use is described. The average particle diameter was measured by a laser diffraction/dispersion method.

TABLE 1

|  | Example 1 | Example 2 | Example 3 | Example 4 | Example 5 | Example 6 | Example 7 | Example 8 |
| --- | --- | --- | --- | --- | --- | --- | --- | --- |
| Bisphenol-A liquid epoxy resin (EEW = 190, Mw = 343) | 100.00 | 100.00 | 100.00 | 100.00 | 100.00 | 100.00 | 100.00 | 100.00 |
| Glycidyl amine liquid epoxy resin (EEW = 120, Mw = 480) |  |  |  |  |  |  |  |  |
| Hemiacetal ester (Synthesis example 1) | 43.47 | 29.98 | 59.96 | 43.47 | 43.47 | 43.47 | 43.47 | 43.47 |
| Equivalent of ethoxybenzoic acid (equivalent: 166, boiling point: 315° C.) relative to an epoxy group | 0.29 | 0.20 | 0.40 | 0.29 | 0.29 | 0.29 | 0.29 | 0.29 |

TABLE 1-continued

| | | | | | | | | |
|---|---|---|---|---|---|---|---|---|
| Equivalent of vinyl ether CHDMDV (equivalent: 88, boiling point: 310° C.) relative to a carboxyl group | 1.35 | 1.35 | 1.35 | 1.35 | 1.35 | 1.35 | 1.35 | 1.35 |
| Hemiacetal ester (Synthesis example 2) | | | | | | | | |
| Equivalent of methoxybenzoic acid (equivalent: 152, boiling point: 200° C.) relative to an epoxy group | | | | | | | | |
| Equivalent of vinyl ether TEGDVE (equivalent: 101, boiling point: 220° C.) relative to carboxyl group | | | | | | | | |
| Hemiacetal ester (Synthesis example 3) | | | | | | | | |
| Equivalent of sebacic acid (equivalent: 101. boiling point: 386° C.) relative to an epoxy group | | | | | | | | |
| Equivalent of isopropyl vinyl ether (equivalent: 86, boiling point: 55° C.) relative to a carboxyl group | | | | | | | | |
| Cyanoguanidine | 5.00 | 5.00 | 5.00 | 4.45 | 5.56 | 5.00 | 5.00 | 5.00 |
| Melamine | 1.00 | 1.00 | 1.00 | 1.00 | 1.00 | 0.89 | 2.00 | 1.00 |
| 2,4-Diamino-6-(2'-methylimidazolyl)ethyl-1.3.5-triazine | | | | | | | | |
| Diaminodiphenyl sulfone | | | | | | | | |
| Spherical silica 1 (average particle diameter: 0.5 μm, 0.3 μm or less in size: 8.5%) | | | | | | | | |
| Spherical silica 2 (average particle diameter: 1.0 μm, 0.3 μm or less in size: 4.6%) | 52.50 | 52.50 | 52.50 | 52.50 | 52.50 | 52.50 | 52.50 | 18.00 |
| Spherical silica 3 (average particle diameter: 5 μm, 0.3 μm or less in size: 1.2%) | | | | | | | | |
| Spherical silica 4 (average particle diameter: 0.3 μm, 0.3 μm or less in size: 50%) | | | | | | | | |
| Spherical silica 5 (average particle diameter: 7 μm. 0.3 μm or less in size: less than 1%) | | | | | | | | |
| Spherical silica 6 (average particle diameter: 0.5 μm, 0.3 μm or less in size: 11.7%) | | | | | | | | |
| Spherical alumina 1 (average particle diameter: 1.0 μm. 0.3 μm or less in size: 6.2%) | | | | | | | | |
| Spherical alumina 2 (average particle diameter: 5.0 μm. 0.3 μm or less in size: 2.1%) | | | | | | | | |
| Glass beads (average particle diameter: 5.0 μm. 0.3 μm or less in size: 1%) | | | | | | | | |
| Defoaming agent (silicone oil) | 0.30 | 0.30 | 0.30 | 0.30 | 0.30 | 0.30 | 0.30 | 0.30 |
| Void (post-defoaming properties) | ◎ | ◯ | ◎ | ◎ | ◯ | ◎ | ◯ | ◎ |
| Curing properties | ◯ | ◯ | ◯ | ◯ | ◯ | ◯ | ◯ | ◯ |
| Solder connection properties | ◯ | ◯ | ◯ | ◯ | ◯ | ◯ | ◯ | ◯ |
| Low curing shrinkability | ◯ | ◯ | ◯ | ◯ | ◯ | ◯ | ◯ | ◯ |
| Reaction ratio of an epoxy group after reflow | 32 | 27 | 38 | 21 | 30 | 31 | 35 | — |

| | Example 9 | Example 10 | Example 11 | Example 12 | Example 13 | Example 14 | Example 15 | Example 16 |
|---|---|---|---|---|---|---|---|---|
| Bisphenol-A liquid epoxy resin (EEW = 190, Mw = 343) | 100.00 | 100.00 | 100.00 | 100.00 | 100.00 | 100.00 | | 100.00 |
| Glycidyl amine liquid epoxy resin (EEW = 120, Mw = 480) | | | | | | | 100.00 | |
| Hemiacetal ester (Synthesis example 1) | 43.47 | 43.47 | 43.47 | 43.47 | 43.47 | 43.47 | 71.20 | |
| Equivalent of ethoxybenzoic acid (equivalent: 166, boiling point: 315° C.) relative to an epoxy group | 0.29 | 0.29 | 0.29 | 0.29 | 0.29 | 0.29 | 0.30 | |
| Equivalent of vinyl ether CHDMDV (equivalent: 88, boiling point: 310° C.) relative to a carboxyl group | 1.35 | 1.35 | 1.35 | 1.35 | 1.35 | 1.35 | 1.35 | |
| Hemiacetal ester (Synthesis example 2) | | | | | | | | 45.53 |
| Equivalent of methoxybenzoic acid (equivalent: 152, boiling point: 200° C.) relative to an epoxy group | | | | | | | | 0.30 |
| Equivalent of vinyl ether TEGDVE (equivalent: 101, boiling point: 220° C.) relative to carboxyl group | | | | | | | | 1.35 |
| Hemiacetal ester (Synthesis example 3) | | | | | | | | |
| Equivalent of sebacic acid (equivalent: 101. boiling point: 386° C.) relative to an epoxy group | | | | | | | | |
| Equivalent of isopropyl vinyl ether (equivalent: 86, boiling point: 55° C.) relative to a carboxyl group | | | | | | | | |
| Cyanoguanidine | 5.00 | 5.00 | 5.00 | 5.00 | 5.00 | 5.00 | 5.00 | 5.00 |
| Melamine | 1.00 | 1.00 | 1.00 | 1.00 | 1.00 | 1.00 | 1.00 | 1.00 |
| 2,4-Diamino-6-(2'-methylimidazolyl)ethyl-1.3.5-triazine | | | | | | | | |
| Diaminodiphenyl sulfone | | | | | | | | |

TABLE 1-continued

| | Ex. 9 | Ex. 10 | Ex. 11 | Ex. 12 | Ex. 13 | Ex. 14 | Ex. 15 | Ex. 16 |
|---|---|---|---|---|---|---|---|---|
| Spherical silica 1 (average particle diameter: 0.5 μm, 0.3 μm or less in size: 8.5%) | | 52.50 | | | | | | |
| Spherical silica 2 (average particle diameter: 1.0 μm, 0.3 μm or less in size: 4.6%) | 100.00 | | | | | | 52.50 | 52.50 |
| Spherical silica 3 (average particle diameter: 5 μm, 0.3 μm or less in size: 1.2%) | | | 52.50 | | | | | |
| Spherical silica 4 (average particle diameter: 0.3 μm, 0.3 μm or less in size: 50%) | | | | | | | | |
| Spherical silica 5 (average particle diameter: 7 μm, 0.3 μm or less in size: less than 1%) | | | | | | | | |
| Spherical silica 6 (average particle diameter: 0.5 μm, 0.3 μm or less in size: 11.7%) | | | | | | | | |
| Spherical alumina 1 (average particle diameter: 1.0 μm, 0.3 μm or less in size: 6.2%) | | | | | 52.50 | | | |
| Spherical alumina 2 (average particle diameter: 5.0 μm, 0.3 μm or less in size: 2.1%) | | | | | | 52.50 | | |
| Glass beads (average particle diameter: 5.0 μm, 0.3 μm or less in size: 1%) | | | | 52.50 | | | | |
| Defoaming agent (silicone oil) | 0.30 | 0.30 | 0.30 | 0.30 | 0.30 | 0.30 | 0.30 | 0.30 |
| Void (post-defoaming properties) | ○ | ○ | ◎ | ◎ | ◎ | ○ | ○ | ○ |
| Curing properties | ○ | ○ | ○ | ○ | ○ | ○ | ○ | ○ |
| Solder connection properties | ○ | ○ | ○ | ○ | ○ | ○ | ○ | ○ |
| Low curing shrinkability | ◎ | ○ | ◎ | ○ | ○ | ○ | ○ | ○ |
| Reaction ratio of an epoxy group after reflow | — | — | — | — | — | — | 34 | 31 |

TABLE 2

| | Example 17 | Example 18 | Example 19 | Example 20 | Example 21 | Example 22 | Example 23 | Example 24 | Example 25 |
|---|---|---|---|---|---|---|---|---|---|
| Bisphenol-A liquid epoxy resin (EEW = 190, Mw = 343) | 100.00 | 100.00 | 100.00 | 100.00 | 100.00 | 100.00 | 100.00 | 100.00 | 100.00 |
| Glycidyl amine liquid epoxy resin (EEW = 120, Mw = 480) | | | | | | | | | |
| Hemiacetal ester (Synthesis example 1) | 22.49 | 68.95 | 43.47 | 43.47 | 43.47 | 43.47 | 43.47 | 43.47 | 43.47 |
| Equivalent of ethoxybenzoic acid (equivalent: 166, boiling point: 315° C.) relative to an epoxy group | 0.15 | 0.46 | 0.29 | 0.29 | 0.29 | 0.29 | 0.29 | 0.29 | 0.29 |
| Equivalent of vinyl ether CHDMDV (equivalent: 88, boiling point: 310° C.) relative to a carboxyl group | 1.35 | 1.35 | 1.35 | 1.35 | 1.35 | 1.35 | 1.35 | 1.35 | 1.35 |
| Hemiacetal ester (Synthesis example 2) | | | | | | | | | |
| Equivalent of methoxybenzoic acid (equivalent: 152, boiling point: 200° C.) relative to an epoxy group | | | | | | | | | |
| Equivalent of vinyl ether TEGDVE (equivalent: 101, boiling point: 220° C.) relative to carboxyl group | | | | | | | | | |
| Hemiacetal ester (Synthesis example 3) | | | | | | | | | |
| Equivalent of sebacic acid (equivalent: 101, boiling point: 386° C.) relative to an epoxy group | | | | | | | | | |
| Equivalent of isopropyl vinyl ether (equivalent: 86, boiling point: 55° C.) relative to a carboxyl group | | | | | | | | | |
| Cyanoguanidine | 5.00 | 5.00 | 4.00 | 6.00 | 5.00 | 5.00 | | | 5.00 |
| Melamine | 1.00 | 1.00 | 1.00 | 1.00 | 0.80 | 2.50 | | | 1.00 |
| 2,4-Diamino-6-(2'-methylimidazolyl)ethyl-1,3,5-triazine | | | | | | | | | |
| Diaminodiphenyl sulfone | | | | | | | | | |
| Spherical silica 1 (average particle diameter: 0.5 μm, 0.3 μm or less in size: 8.5%) | | | | | | | | | |
| Spherical silica 2 (average particle diameter: 1.0 μm, 0.3 μm or less in size: 4.6%) | 52.50 | 52.50 | 52.50 | 52.50 | 52.50 | 52.50 | 10.00 | 120.00 | |
| Spherical silica 3 (average particle diameter: 5 μm, 0.3 μm or less in size: 1.2%) | | | | | | | | | |
| Spherical silica 4 (average particle diameter: 0.3 μm, 0.3 μm or less in size: 50%) | | | | | | | | | 52.50 |
| Spherical silica 5 (average particle diameter: 7 μm, 0.3 μm or less in size: less than 1%) | | | | | | | | | |
| Spherical silica 6 (average particle diameter: 0.5 μm, 0.3 μm or less in size: 11.7%) | | | | | | | | | |
| Spherical alumina 1 (average particle diameter: 1.0 μm, 0.3 μm or less in size: 6.2%) | | | | | | | | | |
| Spherical alumina 2 (average particle diameter: 5.0 μm, 0.3 μm or less in size: 2.1%) | | | | | | | | | |

TABLE 2-continued

| | | | | | | | | | |
|---|---|---|---|---|---|---|---|---|---|
| Glass beads (average particle diameter: 5.0 μm, 0.3 μm or less in size: 1%) | | | | | | | | | |
| Defoaming agent (silicone oil) | 0.30 | 0.30 | 0.30 | 0.30 | 0.30 | 0.30 | 0.30 | 0.30 | 0.30 |
| Void (post-defoaming properties) | ○ | ○ | ○ | X | ○ | X | X | X | X |
| Curing properties | ○ | X | X | ○ | X | ○ | ○ | ○ | ○ |
| Solder connection properties | X | ○ | ○ | X | ○ | X | ○ | X | ○ |
| Low curing shrinkability | X | indeterminable | indeterminable | X | indeterminable | X | X | ○ | ○ |
| Reaction ratio of an epoxy group after reflow | 22 | 53 | 22 | 47 | 30 | 45 | — | — | — |

| | Example 26 | Example 27 | Example 28 | Example 29 | Example 30 | Example 31 | Comparative Example 1 | Comparative Example 2 |
|---|---|---|---|---|---|---|---|---|
| Bisphenol-A liquid epoxy resin (EEW = 190, Mw = 343) | 100.00 | 100.00 | 100.00 | 100.00 | 100.00 | 100.00 | 100.00 | 100.00 |
| Glycidyl amine liquid epoxy resin (EEW = 120, Mw = 480) | | | | | | | | |
| Hemiacetal ester (Synthesis example 1) | 43.47 | 43.47 | 43.47 | 43.47 | 43.47 | 43.47 | | 43.47 |
| Equivalent of ethoxybenzoic acid (equivalent: 166, boiling point: 315° C.) relative to an epoxy group | 0.29 | 0.29 | 0.29 | 0.29 | 0.29 | 0.29 | | 0.29 |
| Equivalent of vinyl ether CHDMDV (equivalent: 88, boiling point: 310° C.) relative to a carboxyl group | 1.35 | 1.35 | 1.35 | 1.35 | 1.35 | 1.35 | | 1.35 |
| Hemiacetal ester (Synthesis example 2) | | | | | | | | |
| Equivalent of methoxybenzoic acid (equivalent: 152, boiling point: 200° C.) relative to an epoxy group | | | | | | | | |
| Equivalent of vinyl ether TEGDVE (equivalent: 101, boiling point: 220° C.) relative to carboxyl group | | | | | | | | |
| Hemiacetal ester (Synthesis example 3) | | | | | | | 34.28 | |
| Equivalent of sebacic acid (equivalent: 101, boiling point: 386° C.) relative to an epoxy group | | | | | | | 0.30 | |
| Equivalent of isopropyl vinyl ether (equivalent: 86, boiling point: 55° C.) relative to a carboxyl group | | | | | | | 1.35 | |
| Cyanoguanidine | 5.00 | 5.00 | 5.00 | | | | 5.00 | 5.00 |
| Melamine | 1.00 | 1.00 | | 1.00 | | | 1.00 | 1.00 |
| 2,4-Diamino-6-(2'-methylimidazolyl)ethyl-1,3,5-triazine | | | 1.00 | 5.00 | 6.00 | | | |
| Diaminodiphenyl sulfone | | | | | | 6.00 | | |
| Spherical silica 1 (average particle diameter: 0.5 μm, 0.3 μm or less in size: 8.5%) | | | | | | | | |
| Spherical silica 2 (average particle diameter: 1.0 μm, 0.3 μm or less in size: 4.6%) | | | 52.50 | 52.50 | 52.50 | 52.50 | 52.50 | |
| Spherical silica 3 (average particle diameter: 5 μm, 0.3 μm or less in size: 1.2%) | | | | | | | | |
| Spherical silica 4 (average particle diameter: 0.3 μm, 0.3 μm or less in size: 50%) | | | | | | | | |
| Spherical silica 5 (average particle diameter: 7 μm. 0.3 μm or less in size: less than 1%) | 52.50 | | | | | | | |
| Spherical silica 6 (average particle diameter: 0.5 μm, 0.3 μm or less in size: 11.7%) | | 52.50 | | | | | | |
| Spherical alumina 1 (average particle diameter: 1.0 μm, 0.3 μm or less in size: 6.2%) | | | | | | | | |
| Spherical alumina 2 (average particle diameter: 5.0 μm, 0.3 μm or less in size: 2.1%) | | | | | | | | |
| Glass beads (average particle diameter: 5.0 μm, 0.3 μm or less in size: 1%) | | | | | | | | |
| Defoaming agent (silicone oil) | 0.30 | 0.30 | 0.30 | 0.30 | 0.30 | 0.30 | 0.30 | 0.30 |
| Void (post-defoaming properties) | ○ | X | X | X | X | X | X | ○ |
| Curing properties | ○ | ○ | ○ | ○ | ○ | ○ | ○ | ○ |
| Solder connection properties | X | ○ | X | ○ | X | ○ | X | ○ |
| Low curing shrinkability | X | ○ | ○ | ○ | ○ | ○ | X | X |
| Reaction ratio of an epoxy group after reflow | — | — | 99 | 99 | 99 | 80 | 99 | 34 |

<Synthesis of Hemiacetal Ester>

The hemiacetal esters shown in Tables 1 and 2 were synthesized as follows.

Synthesis Example 1 (Refer to Example 1)

A mixture of 25.34 parts by mass of ethoxybenzoic acid (equivalent: 166, boiling point: 315° C.), corresponding to 0.29 equivalents relative to sn epoxy group of an epoxy resin, and 18.13 parts by weight of cyclohexane dimethanol divinyl ether (equivalent: 88, boiling point: 310° C.), corresponding to 1.35 equivalents relative to a carboxyl group of ethoxybenzoic acid, was stirred for reaction at 80° C. for 10 hours. After completion of the reaction, the reaction product was subjected to FT-IR measurement to confirm the disappearance of absorption of carboxyl group.

Synthesis Example 2 (Example 16)

Except that 24.00 parts by mass of methoxybenzoic acid (equivalent: 152, boiling point: 200° C.), corresponding to 0.30 equivalents relative to an epoxy group of an epoxy resin, and 21.53 parts by mass of triethylene glycol divinyl ether (equivalent: 101, boiling point: 220° C.), corresponding to 1.35 equivalents relative to a carboxyl group of methoxybenzoic acid, were used, the reaction was performed in the same manner as in the synthesis example 1. The reaction product was subjected to FT-IR measurement to confirm the disappearance of absorption of carboxyl group.

Synthesis Example 3 (Comparative Example 1)

Except that 15.95 parts by mass of sebacic acid, i.e. a bifunctional carboxylic acid, (equivalent: 101, boiling point: 386° C.), corresponding to 0.30 equivalents relative to an epoxy group of an epoxy resin, and 18.33 parts by mass of isopropyl monovinyl ether, i.e. a monovinyl ether, (equivalent: 86, boiling point: 55° C.), corresponding to 1.35 equivalents relative to a carboxyl group of methoxybenzoic acid, were used, the reaction was performed in the same manner as in the synthesis example 1. The reaction product was subjected to FT-IR measurement to confirm the disappearance of absorption of carboxyl group.

In Tables 1 and 2, the numerical values shown in the column of carboxylic acid in the synthesis examples 1 to 3 indicate the equivalents of carboxylic acid for use in the synthesis relative to the epoxy group. The numerical values shown in the column of vinyl ether indicate the equivalents of vinyl ether for use in the synthesis relative to the carboxyl group.

The semiacetalization from a polyfunctional carboxylic acid and a polyfunctional vinyl ether is not preferred due to polymerization during reaction to produce a gelled product.

<Circuit Board and Chip>

For evaluation of the heat curable resin composition, a circuit board having connecting lands (30-mm square, thickness: 0.4 mm, number of connecting lands: 196, pitch of connecting lands: 300 μm, surface treatment of connecting lands: nickel-gold plating) was used as the circuit board 1, and a TEG chip for testing (4.2-mm square, thickness: 0.4 mm, number of bumps: 196, pitch of bumps: 300 μm, solder type: alloy of 96.5 mass % tin, 3.0 mass % silver, and 0.5 mass % copper) was used as the electronic component. A daisy chain circuit was formed from the circuit board and the TEG chip for testing for a continuity test.

<Testing Method>

To the land part of a circuit board, 3 mg of the heat curable resin composition in Examples or Comparative Examples was applied with a dispenser. A TEG chip for evaluation was placed thereon, and soldering was performed with a reflow device (preheating: 120 to 140° C. for 60 seconds, temperature rise: 140 to 220° C. for 8 seconds, reflow: 220 to 260° C. for 12 seconds). After the completion of soldering, using a vacuum chamber with a hot plate, the sample was heated to 120° C. and vacuum operation (ultimate vacuum: 100 kPa, 15 minutes) was performed. After the vacuum operation, the sample was taken out from the vacuum chamber and heat cured at 160° C. for 2 hours with a drying machine. A TEG-mounted board was thus obtained.

<Evaluation Method and Criteria>

The TEG-mounted board obtained as described above was evaluated from the viewpoints of voids (post-defoaming properties), curing properties, solder connection properties, and low curing shrinkability as shown in Tables 1 and 2. The evaluation method and criteria for each evaluation are as follows.

(Void: Post-Defoaming Properties)

In order to check voids, the TEG chip mounted on a board was polished with a polishing machine until the cured product of heat curable resin emerged, and then visually observed with a microscope with a magnification power of 20. A sample having no void was defined as ⊚, a sample having 3 or less voids with a size of 75 μm, i.e. a half of the distance between bumps, or less was defined as ◯, and a sample having a void with a size of more than 75 μm, and having 4 or more voids was defined as x.

(Curing Properties)

In order to measure the curing properties, the heat curable resin composition was printed on the same circuit board as described above with a 150-mesh screen plate having 2-mm square openings, so as to have a thickness of about 50 μm, and cured under the same conditions as described above for the measurement of scratch hardness in accordance with JIS K 5600-5-4 (pencil method). The measured coating film having a pencil hardness of 2H or more was heated at 160° C. for 1 hour again. A sample having no change (sagging or extinction) of the pencil scratch after heating was defined as ◯, and a sample having a pencil hardness of H or less, or a sample having a change of the pencil scratch by the reheating was defined as x.

(Solder Connection Properties)

In order to evaluate the solder connection properties, a continuity test was performed using a daisy chain circuit formed on the mounted board. A sample having conductivity was defined as ◯, and a sample having no conductivity was defined as x.

(Low Curing Shrinkability)

In order to evaluate the low curing shrinkability, a cross section cut from a circuit board with a TEG chip for evaluation mounted thereon was observed with a microscope with a magnification power of 50. A sample with a cross section completely filled was defined as ◯, and a sample with a gap on the circuit board-side or the TEG chip-side was defined as x.

<Reaction Ratio of an Epoxy Group after Reflow>

From the intensity ratio of the absorption peak of an epoxy group at 910 $cm^{-1}$ to the absorption peak of a benzene ring at 1508 $cm^{-1}$ in the FT-IR chart of a heat curable resin composition before testing, and the intensity ratio between the absorption peaks of a benzene ring and an epoxy group in the FT-IR chart of a heat curable resin composition after reflow, the reaction ratio of an epoxy group was calculated.

<Results of Examples and Comparative Examples>

In Examples, samples have a smaller number of voids in general, so that the excellence in post-defoaming properties was confirmed. In Examples 1 to 16, in particular, samples included: 1) a liquid epoxy resin, 2) a hemiacetal ester synthesized from 0.2 to 0.4 equivalents of monocarboxylic acid (benzoic acid) relative to an epoxy group of the epoxy resin and 1.0 to 1.5 equivalents of polyvinyl ether relative to a carboxyl group of the monocarboxylic acid, 3) a curing agent containing 0.4 to 0.5 equivalents of cyanoguanidine relative to an epoxy group of the epoxy resin and 0.08 to 0.18 equivalents of melamine relative to an epoxy group, 4) 10 to 40 mass % of spherical filler having an average particle diameter of 0.5 to 5 μm, with 5) a cumulative content of a fine particle having a size of 0.3 μm or less contained in the filler of 10 mass % or less relative to the total content of the filler, and with 6) a reaction ratio of an epoxy group in the epoxy resin of 40% or less after reflow at 220 to 260° C. for 10 to 20 seconds; and obtained high evaluation in all the evaluation tests listed in Table 1.

In Examples 17 to 31, the results were inferior to those in Examples 1 to 16. More specifically, the results are shown as follows.

In Example 17, carboxylic acid was consumed by an epoxy group, so that the removal properties of oxide films were insufficient.

In Example 18, due to the reaction between carboxylic acid and an epoxy group, the amount of an epoxy group was insufficient for curing.

In Example 19, the amount of curing agent was deficient.

In Example 20, the reaction proceeded during reflow to cause gelling.

In Example 21, due to the deficiency of curing agent, curing was insufficient.

In Example 22, the reaction proceeded during reflow to cause gelling. Furthermore, due to solidification of the resin before melting of solder, the connection failed.

In Example 23, the occurrence of a gap was found on the TEG-side in observation of the cross section after curing.

In Example 24, due to increased viscosity of the composition, post-defoaming was impossible. Particles reduced the wetting properties of solder, resulted in connection failure.

In Example 25, due to increased viscosity of the composition, post-defoaming was impossible.

In Example 26, large particles reduced the wetting properties of solder, resulting in connection failure.

In Example 27, due to increased viscosity of the composition, post-defoaming was impossible.

In Examples 28 to 31, the reaction proceeded during reflow to cause gelling. Furthermore, due to solidification before melting of solder, the connection failed.

In Comparative Example 1, bifunctional sebacic acid was used as carboxylic acid. Due to heating during reflow, the three-dimensional curing of the epoxy resin proceeded, so that the solder connection properties were hindered and defoaming properties also lowered with a large number of voids remaining.

In Comparative Example 2, due to no addition of filler, curing shrinkage increased to cause detachment of the underfill and the TEG chip.

What is claimed is:

1. A heat curable resin composition comprising:
    a liquid epoxy resin,
    a hemiacetal ester synthesized from monocarboxylic acid and polyvinyl ether,
    a curing agent comprising cyanoguanidine and melamine, and
    a filler,
    wherein the hemiacetal ester is synthesized from 0.2 to 0.4 equivalents of monocarboxylic acid relative to an epoxy group of the epoxy resin and 1.0 to 1.5 equivalents of polyvinyl ether relative to a carboxyl group of the monocarboxylic acid,
    wherein the curing agent comprises 0.4 to 0.5 equivalents of cyanoguanidine relative to an epoxy group of the epoxy resin and 0.08 to 0.18 equivalents of melamine relative to the epoxy group,
    wherein a content of the filler is 10 to 40 mass %,
    wherein the epoxy resin is one or more of a bisphenol-A epoxy resin, a bisphenol-F epoxy resin, a glycidyl amine epoxy resin, and an alicyclic epoxy resin,
    wherein the monocarboxylic acid is an aromatic monocarboxylic acid and/or a polycyclic aromatic monocarboxylic acid,
    wherein the polyvinyl ether is an aliphatic polyvinyl ether and/or an alicyclic polyvinyl ether,
    wherein the filler is a spherical filler, and
    wherein the heat curable composition has solder connection properties.

2. The heat curable resin composition according to claim 1, wherein the filler having an average particle diameter of 0.5 to 5 μm.

3. The heat curable resin composition according to claim 1, wherein the filler contains a fine particle having a size of 0.3 μm or less with a cumulative content of 10 mass % or less relative to the total filler content.

4. The heat curable resin composition according to claim 1, wherein the reaction ratio of an epoxy group in the epoxy resin is 40% or less after reflow at 220 to 260° C., for 10 to 20 seconds.

5. A circuit board with an electronic component mounted thereon comprising:
    circuit board,
    an electronic component mounted on the circuit board, and
    a cured product obtained by heat-curing the heat curable resin composition according to claim 1, disposed between the circuit board and the electronic component.

* * * * *